United States Patent
Takagi et al.

(10) Patent No.: US 7,452,604 B2
(45) Date of Patent: Nov. 18, 2008

(54) REFLECTIVE AG ALLOY FILM FOR REFLECTORS AND REFLECTOR PROVIDED WITH THE SAME

(75) Inventors: Katsutoshi Takagi, Kobe (JP); Toshiki Sato, Kobe (JP); Junichi Nakai, Kobe (JP); Yuuki Tauchi, Kobe (JP)

(73) Assignee: Kabushiki Kaisha Kobe Seiko Sho, Kobe-shi (JP)

( * ) Notice: Subject to any disclaimer, the term of this patent is extended or adjusted under 35 U.S.C. 154(b) by 0 days.

(21) Appl. No.: 10/871,493

(22) Filed: Jun. 21, 2004

(65) Prior Publication Data

US 2005/0008883 A1 Jan. 13, 2005

(30) Foreign Application Priority Data

Jul. 7, 2003 (JP) .............................. 2003-271438

(51) Int. Cl.
*B32B 9/00* (2006.01)
(52) U.S. Cl. ........................ 428/426; 428/432; 428/469; 428/612; 428/687; 428/698
(58) Field of Classification Search ................. 428/612, 428/687, 220, 457, 469, 428, 432, 697, 698, 428/699, 701, 702, 707
See application file for complete search history.

(56) References Cited

U.S. PATENT DOCUMENTS

| | | | |
|---|---|---|---|
| 6,301,200 B1 * | 10/2001 | Aspen et al. ............. | 369/275.2 |
| 6,689,444 B2 * | 2/2004 | Nakai et al. ................. | 428/64.1 |
| 6,697,323 B1 * | 2/2004 | Miki ....................... | 369/275.1 |
| 2002/0097512 A1 | 7/2002 | Grunwald et al. | |
| 2002/0150772 A1 * | 10/2002 | Nakai et al. ................. | 428/457 |
| 2002/0181110 A1 | 12/2002 | Bower et al. | |
| 2003/0143342 A1 * | 7/2003 | Fujii et al. .................... | 428/1.1 |
| 2004/0005432 A1 * | 1/2004 | Ridout et al. ............. | 428/64.4 |
| 2004/0263984 A1 * | 12/2004 | Nakai et al. ................. | 359/586 |
| 2005/0008883 A1 | 1/2005 | Takagi et al. | |
| 2005/0023472 A1 * | 2/2005 | Wei et al. ..................... | 250/368 |

FOREIGN PATENT DOCUMENTS

| | | |
|---|---|---|
| JP | 2-109003 | 4/1990 |
| JP | 8-234004 | 9/1996 |
| JP | 9-135096 | 5/1997 |
| JP | 10-153788 | 6/1998 |
| JP | 11-231122 | 8/1999 |
| JP | 2000-106017 | 4/2000 |
| JP | 2001-226765 | 8/2001 |
| JP | 2002-323611 | 11/2002 |
| JP | 2003-34828 | 2/2003 |
| JP | 2003-89830 | 3/2003 |
| JP | 2003-160826 | 6/2003 |

OTHER PUBLICATIONS

U.S. Appl. No. 10/971,142, filed Oct. 25, 2004, Nakai, et al.
U.S. Appl. No. 10/871,493, filed Jun. 21, 2004, Takagi, et al.
U.S. Appl. No. 10/999,027, filed Nov. 30, 2004, Takagi, et al.
U.S. Appl. No. 11/103,615, filed Apr. 12, 2005, Takagi, et al.
U.S. Appl. No. 11/158,079, filed Jun. 22, 2005, Tauchi, et al.
U.S. Appl. No. 11/168,497, filed Jun. 29, 2005, Takagi, et al.
U.S. Appl. No. 11/375,036, filed Mar. 15, 2006, Tauchi, et al.
Korean Office Action as received in corresponding application No. 2004-0052242 dated May 20, 2006 w/English Translation.
U.S. Appl. No. 11/428,045, filed Jun. 30, 2006, Fujii, et al.
U.S. Appl. No. 11/425,062, filed Jun. 19, 2006, Tauchi, et al.
U.S. Appl. No. 11/425,068, filed Jun. 19, 2006, Nakai, et al.

* cited by examiner

*Primary Examiner*—Timothy M Speer
(74) *Attorney, Agent, or Firm*—Oblon, Spivak, McClelland, Maier & Neustadt, P.C.

(57) ABSTRACT

A reflective Ag alloy film for reflectors, which has excellent surface flatness and shows high reflectivity even under a heating environment and a reflector.

The reflective Ag alloy film for reflectors has an average surface roughness of 2.0 nm or less and contains a rare earth element (such as Nd) in a content in the range of 0.1 to 3.0 at %, or further at least one selected from Au, Pd, Cu and Pt in a content in the range of 0.5 to 5.0 at %. The reflector comprises the above reflective Ag alloy film formed on a substrate.

21 Claims, No Drawings

REFLECTIVE AG ALLOY FILM FOR REFLECTORS AND REFLECTOR PROVIDED WITH THE SAME

BACKGROUND OF THE INVENTION

1. Field of the Invention

The present invention relates to a reflective Ag alloy film for reflectors and to a reflector comprising the same. Specifically, it relates to a reflective Ag alloy film for reflectors which has a high reflectivity and rarely experiences a reduction in reflectivity by heating and to a reflector comprising the same.

2. Description of the Related Art

An Ag film has been used for many purposes as it has a high reflectivity for visible light. For example, it is used for reflectors for automotive lamps, backlights for liquid crystal displays, reflectors for lighting devices, mirrors for optical parts and reflectors for light emitting parts such as LED's. A reflector comprising an Ag film is manufactured by coating a glass or resin substrate with Ag by sputtering or the like, and the Ag film is thus used as a reflective film for reflectors.

However, the Ag film is unsatisfactory in terms of environmental durability. As it is deteriorated by moisture, it is difficult to use it for a long time. Further, Ag is easily diffused by heating at 100 to 200° C. and the cohesion of Ag occurs, thereby reducing its reflectivity.

Therefore, it is proposed to increase its chemical stability by adding various precious metals to Ag as shown in JP-A 2001-226765 (patent document 1). Although the chemical stability under a wet environment is increased in this method, the average surface roughness of the film is deteriorated by a rise in temperature caused by radiation from a lamp. Therefore, the improvement of durability is not attained yet and a problem to be solved for its practical use still remains.

The formation of a transparent protective layer on an Ag film is effective in improving its durability. An organic resin or metal oxide shown in JP-A 2000-106017 (patent document 2) is generally used in the protective layer. Even when the Ag film is coated with these, an organic resin film involves a problem such as light absorption by the protective layer and a reaction with a component of the protective layer, and a metal oxide film has a problem that deterioration is caused by a defect such as a pin hole.

[patent document 1] JP-A 2001-226765
[Patent document 2] JP-A 2000-106017

SUMMARY OF THE INVENTION

Surface flatness is lost by the Ag alloy film proposed above because the cohesion of Ag proceeds by heating along the passage of time and there occurs a phenomenon that the reflectivity of light having a wavelength of 400 to 450 nm in particular drops. Therefore, the Ag alloy film must be coated relatively thick, whereby the high reflectivity of the Ag alloy film is impaired, its productivity drops, or the deterioration (roughened surface) of the Ag alloy film proceeds from a scratched or peeled portion of the coating material, thereby reducing the yield.

It is an object of the present invention which has been made in view of the above situation to provide a reflective Ag alloy film which has excellent surface flatness and shows high reflectivity even under a heating environment as well as a reflector comprising this reflective Ag alloy film having the above excellent characteristic properties.

The inventors of the present invention have conducted intensive studies to attain the above object and have accomplished the present invention. The above object can be attained by the present invention.

The present invention which has been accomplished and attained the above object relates to a reflective Ag alloy film for reflectors and a reflector comprising this reflective Ag alloy film.

That is, according to a first aspect of the present invention, there is provided a reflective Ag alloy film for reflectors which has an average surface roughness Ra of 2.0 nm or less.

According to a second aspect of the present invention, there is provided a reflective Ag alloy film for reflectors which contains a rare earth element in a content in the range of 0.1 to 3.0 at %.

According to a third aspect of the present invention, there is provided a reflective Ag alloy film for reflectors, wherein the rare earth element is Nd.

According to a fourth aspect of the present invention there is provided a reflective Ag alloy film for reflectors which contains at least one selected from Au, Pd, Cu and Pt in a content in the range of 0.5 to 5.0 at %.

According to a fifth aspect of the present invention, there is provided a reflective Ag alloy film for reflectors which has a thickness of 50 to 300 nm.

According to a sixth aspect of the present invention, there is provided a reflective Ag alloy film for reflectors which is obtained by heating at 50 to 200° C. at the time of film formation.

According to a seventh aspect of the present invention, there is provided a reflector comprising the above reflective Ag alloy film for reflectors formed on a substrate.

According to an eighth aspect of the present invention there is provided a reflector, wherein a film containing at least one selected from the group consisting of an oxide, nitride and oxynitride is formed on the substrate as a primer layer.

The reflective Ag alloy film for reflectors of the present invention has excellent surface flatness and shows a high reflectivity even under a heating environment. Therefore, it can be advantageously used as a reflective Ag alloy film for reflectors and its function can be improved.

Since the reflector of the present invention comprises the reflective Ag alloy film for reflectors having the above excellent characteristic properties of the present invention formed on a substrate, it has excellent surface flatness and a high reflectivity even under a heating environment and its function can be improved.

DETAILED DESCRIPTION OF THE PREFERRED EMBODIMENTS

To attain the above object, the inventors of the present invention have formed Ag alloy thin films which differ in composition under various film forming conditions on a substrate and have evaluated the characteristic properties of the films as reflective Ag alloy films for reflectors. As a result, they have found that the average surface roughness (Ra) of the Ag alloy thin film must be 2.0 nm or less to attain the high reflectivity of Ag alloy and further that reflectivity is reduced when the average surface roughness of an Ag alloy thin film is increased by heating or the like, that is, reflectivity is hardly reduced when a change in average surface roughness is small even under a heating environment. Further, it has been found that the addition of a rare earth element, particularly Nd is effective for realizing an Ag alloy thin film having excellent flatness which rarely changes in average surface roughness. The present invention has been accomplished based on these findings. A reflective Ag alloy film for reflectors according to the present invention will be mainly described hereinbelow. The average surface roughness Ra means arithmetic average surface roughness.

The reflective Ag alloy film for reflectors according to the present invention is a reflective Ag alloy film for reflectors which has an average surface roughness Ra of 2.0 nm or less (first aspect). That is, it is a reflective film which is an Ag alloy thin film having an average surface roughness of 2.0 nm or less.

As for an Ag alloy thin film, its reflectivity at the lower limit range (wavelength of about 400 nm) of visible light drops as its average surface roughness Ra increases. This is caused by geometrical engineering scattering and absorption by plasmon on the surface which depend on surface configuration. Since Ag is hardly oxidized and diffused very fast, Ag atoms are readily moved by heating or the like, thereby causing an increase in the average surface roughness of the Ag alloy thin film. As for an Al alloy thin film which is used as a reflective film like an Ag alloy thin film, the change of its surface configuration does not occur substantially due to the protection function of an oxide film on the surface.

Consequently, to maintain the high reflectivity of Ag, the Ag alloy thin film must maintain excellent surface flatness with a small average surface roughness Ra. To this end, the Ag alloy thin film must have excellent surface flatness in the initial stage (stage before the film is exposed to a heating environment after it is formed) and also under a heating environment. Stated more specifically, the average surface roughness Ra of the Ag alloy thin film must be maintained at 2.0 nm or less. To this end, the average surface roughness Ra of the Ag alloy thin film must be 2.0 nm or less in the initial stage and also under a heating environment. When the average surface roughness Ra of the Ag alloy thin film is higher than 2.0 nm, the reflectivity at a short wavelength range of the Ag alloy thin film becomes almost the same as that of an Al film and a merit obtained from the high reflectivity of the Ag alloy thin film is lost. The average surface roughness Ra of the Ag alloy thin film is desirably maintained at 1.0 nm or less. When it is so, high reflectivity can be maintained with higher certainty (at a higher level).

The reflective Ag alloy film for reflectors according to the present invention can maintain the high reflectivity of Ag as understood from the above description. That is, the reflective Ag alloy film for reflectors according to the present invention has an average surface roughness Ra of 2.0 nm or less as described above. That is, as it is a reflective Ag alloy film which maintains its average surface roughness Ra at 2.0 nm or less, its average surface roughness Ra is 2.0 nm or less in the initial stage and also under a heating environment, whereby a high reflectivity can be maintained. That is, it has excellent surface flatness and shows high reflectivity even under a heating environment.

To maintain the average surface roughness Ra of the Ag alloy thin film at 2.0 nm or less, the type and content of an element to be added must be suitably controlled. That is, by suitably controlling the type and content of the element, an Ag alloy thin film having an average surface roughness Ra of 2.0 nm or less after film formation and can maintain its average surface roughness Ra at 2.0 nm or less can be obtained.

To obtain an Ag alloy thin film which has an average surface roughness Ra of 2.0 nm or less after film formation and can maintain its average surface roughness at 2.0 nm or less, the element to be added is a rare earth element and its addition is effective.

The content of this rare earth element is desirably 0.3 at % or more. When the rare earth element is added (contained) in a content in the range of 0.3 at % or more, the growth of crystal grains caused by the surface diffusion of Ag can be effectively suppressed even under a heating environment, thereby making it possible to suppress a change (increase) in average surface roughness. That is, the surface diffusion and cohesion of Ag hardly occur even under a heating environment (excellent heat resistance), and the growth of crystal grains hardly occurs, whereby a change (increase) in average surface roughness hardly occurs. That is, an increase in average surface roughness (reduction in surface flatness) caused by heating is eliminated or reduced by the improvement of heat resistance.

Since the initial reflectivity (reflectivity when the film is not exposed to a heating environment or a high-temperature high-humidity environment after film formation) drops as the content of the rare earth element increases, the content of the rare earth element is desirably 3.0 at % or less. When the content of the rare earth element is larger than 3.0 at %, the difference in reflectivity between the Al alloy thin film and the Ag alloy thin film becomes small and a merit obtained from the high reflectivity of the Ag alloy is not obtained.

It is desired from the above that the content of the rare earth element should be 0.1 to 3.0 at % [second aspect]. When it is so, an Ag alloy thin film which has an average surface roughness Ra of 2.0 nm or less after film formation and can maintain its average surface roughness Ra at 2.0 m or less, that is, an Ag alloy thin film which has excellent surface flatness and high initial reflectivity in the initial stage and has excellent surface flatness and high reflectivity even under a heating environment can be obtained. In other words, an Ag alloy thin film which has excellent surface flatness and high initial reflectivity in the initial stage and has a small reduction in surface flatness caused by heating and excellent surface flatness and high reflectivity even under a heating environment can be obtained. When two or more rare earth elements are added, the total content of these elements is 0.1 to 3.0 at %. To achieve a higher initial reflectivity, the total content of the rare earth elements is desirably 2.0 at % or less.

Out of the above rare earth elements, the addition of Nd is particularly effective. That is, when Nd is added, particularly heat resistance becomes high (the surface diffusion and cohesion of Ag hardly occur under a heating environment), thereby making it possible to effectively suppress the growth of crystal grains caused by the surface diffusion of Ag and a change (increase) in average surface roughness, to reduce a reduction in surface flatness caused by heating and to maintain its average surface roughness Ra at 2.0 nm or less with higher certainty. The initial reflectivity also becomes higher. Therefore, it is desired that Nd should be used out of the above rare earth elements and that the content of Nd should be 0.1 to 3.0 at % [third aspect]. The content of Nd is preferably 0.3 to 3.0 at %.

When the rare earth element is added in a content in the range of 0.1 to 3.0 at % as described above and at least one of Au, Pd, Cu and Pt is added in a content in the range of 0.5 at % or more, chemical stability increases and resistance to a halogen ion in particular improves. Since the initial reflectivity drops as the content of the above element (at least one of Au, Pd, Cu and Pt) increases, the content of the element is desirably 5.0 at % or less. Therefore, it is desired that at least one of Au, Pd, Cu and Pt should be added in a content in the range of 0.5 to 5.0 at % [fourth aspect]. When two or more of these elements are added, the total content of these elements is 0.5 to 5.0 at %. To further increase the initial reflectivity, the total content of these elements is desirably 3.0 at % or less. Out of these elements, the resistance to the halogen ion of Au is higher than that of Cu and the resistance to the halogen ion of Pd is higher than that of Pt. Therefore, the addition of Pd is the most effective in increasing resistance to the halogen ion.

It is desired that the reflective Ag alloy film for reflectors according to the present invention should have a thickness of 50 to 300 nm [fifth aspect]. When the thickness of the reflective Ag alloy film is smaller than 50 nm, light passes through the film, whereby sufficiently high reflectivity is hardly obtained. Since the average surface roughness becomes higher as the thickness increases, when the thickness of the film is larger than 300 nm, a flat surface is not obtained and a high reflectivity is hardly obtained.

When a film is formed by heating a substrate at 50 to 200° C. from the viewpoint of adhesion, the growth of crystal grains can be suppressed and a reflective Ag alloy film having a flat surface can be obtained. Therefore, a film may be formed under heating at 50 to 200° C. When a film is formed under heating, the adhesion of the film can be improved [sixth aspect].

The reflective Ag alloy film for reflectors according to the present invention may comprise an Ag alloy thin film containing no rare earth formed on an Ag alloy thin film containing a rare earth element, specifically Nd. When the film has the above structure, it has a very flat surface with an average surface roughness Ra of 2.0 nm or less and high reflectivity and more excellent heat resistance as its heat resistance is improved by the Ag alloy thin film containing a rare earth element as a primer layer.

The reflector according to the present invention comprises the reflective Ag alloy film for reflectors according to the present invention formed on a substrate [seventh aspect]. This reflector has excellent surface flatness and shows a high reflectivity even under a heating environment.

The formation of the above reflective Ag alloy film on the substrate is carried out by sputtering or PVD (physical vapor deposition) process such as vapor deposition. The material and shape of the substrate are suitably selected. For example, a resin, glass or metal is used. Further, to improve adhesion and barrier properties, a film containing at least one selected from the group consisting of an oxide, nitride and oxynitride may be formed on the substrate as a primer layer [eighth aspect]. This primer layer is not limited to a film containing only an oxide, a film containing only a nitride or a film containing only an oxynitride, and a film containing two or more of these and a film containing these and another substance may also be used. The film containing only an oxide is not limited to a film containing only one oxide but a film containing two or more oxides may be used. The same can be said of the film containing only a nitride, and a film containing two or more nitrides may also be used. The same can be said of the film containing only an oxy nitride, and a film containing two or more oxynitrides may also be used.

As for the above primer layer, examples of the film containing an oxide include films containing an oxide such as zinc oxide, tin oxide, titanium oxide, indium oxide, ITO, yttrium oxide, zirconium oxide or aluminum oxide as the main component. Examples of the film containing a nitride include films containing a nitride such as silicon nitride, aluminum nitride or boron nitride as the main component. Examples of the film containing an oxynitride include films containing an oxynitride such as sialon as the main component.

The method of forming the above primer layer is not particularly limited. A method suitable for the composition of the primer layer is used to form the primer layer on the substrate. This method is selected from sputtering, plasma CVD (chemical vapor deposition) and sol-gel method.

To further improve durability and weatherability or chemical resistance, abrasion resistance, scratch resistance and resistance to the cohesion of Ag according to its use environment, a protective film may be formed on the reflective Ag alloy film (Ag alloy thin film).

An Ag alloy sputtering target containing a rare earth element may be used as the sputtering target for forming the reflective Ag alloy film for reflectors containing a rare earth element according to the present invention.

An Ag alloy target manufactured by a melting/casting method (to be referred to as "cast Ag alloy target" hereinafter) is preferably used as the above Ag alloy sputtering target. Since the cast Ag alloy target is homogenous in terms of composition and uniform in sputtering yield and ejection angle, an Ag alloy thin film having uniform composition is obtained stably, whereby an Ag alloy film forming material having higher performance is obtained. When the oxygen content of the above cast Ag alloy target is controlled (preferably to 100 ppm or less), the film forming rate can be easily maintained at a constant value and the oxygen content of the Ag alloy thin film can be reduced, thereby making it possible to enhance the corrosion resistance of this Ag alloy thin film.

The Ag alloy sputtering target used to form the reflective Ag alloy film for reflectors according to the present invention preferably contains rare earth elements in a content in the range of 0.1 to 3.0 at %. A reflective Ag alloy film for reflectors which contains rare earth elements in a content in the range of 0.1 to 3.0 at % and has an average surface roughness Ra of 2.0 nm or less can be formed by using this Ag alloy sputtering target.

Sputtering conditions for forming the reflective Ag alloy film for reflectors according to the present invention by sputtering are not particularly limited. Although an Ag alloy thin film (reflective Ag alloy film) having the same composition as that of the sputtering target is formed on the substrate by sputtering, Ag or alloy element may be concentrated somewhat according to conditions, and a slight difference (difference of a level to the second decimal place) may be seen between the composition of the target and the composition of the Ag alloy thin film. An Ag alloy thin film having desired composition can be obtained by adjusting sputtering conditions (such as power).

When Nd is contained as the rare earth element in a content in the range of 0.1 to 3.0 at %, a reflective Ag alloy film containing 0.1 to 3.0 at % of Nd can be formed.

When at least one of Au, Pd, Cu and Pt is contained in a content in the range of 0.5 to 5.0 at %, a reflective Ag alloy film containing 0.5 to 5.0 at % of at least one of Au, Pd, Cu and Pt can be formed.

To form the reflective Ag alloy film for reflectors according to the present invention, physical deposition such as vacuum deposition and chemical deposition such as CVD may be employed besides sputtering.

EXAMPLES

Examples and Comparative Examples of the present invention are given below. The present invention is not limited to these examples and modifications may be made in the invention without departing from the spirit and scope of the invention and are included in the technical scope of the invention. "%" used for showing composition of the alloy in the following examples and comparative examples means "at %."

Example 1 and Comparative Example 1

An Ag-0.7% Nd-0.9% Cu cast target having a diameter of 101.6 mm (cast Ag alloy target having an Nd content of 0.7 at % and a Cu content of 0.9 at %) was used to form a 100 nm-thick Ag alloy thin film on a glass substrate (Corning #1737, diameter: 50 mm, thickness: 0.5 mm) by DC magnetron sputtering so as to obtain a specimen A.

A pure Ag target having a diameter of 101.6 mm was used to form a 100 nm-thick pure Ag thin film on the same glass substrate as above in the same manner as above so as to obtain a specimen B.

An Al-1.0% Ti cast target having a diameter of 101.6 mm (cast Al alloy target having a Ti content of 1.0 at %) was used to form a 100 nm-thick Al alloy thin film on the same glass substrate as above in the same manner as above so as to obtain a specimen C.

As for the film forming conditions for all the above specimens, the substrate temperature was room temperature, the distance between target and substrate was 55 mm, and the film forming power was 100 W. To change the average surface roughness of the obtained Ag alloy thin film and the average surface roughness of the pure Ag thin film, the pressure of Ar gas at the time of film formation was changed between 2 and 10 mTorr.

To investigate the compositions of the above Ag alloy thin film and the Al alloy thin film, the same cast Ag alloy target and the cast Al alloy target as above were used to form an Ag alloy thin film and an Al alloy thin film on float glass in order to analyze the compositions of the films by ICP.

Part of the above specimen B (pure Ag thin film/glass substrate) was heated in a vacuum heating furnace (degree of vacuum: lower than $1 \times 10^{-5}$ Torr) at 150° C. for 1 hour and at 200° C. for 1 hour.

The specimen A (Ag alloy thin film/glass substrate), specimen B (pure Ag thin film/glass substrate), heated specimen B and specimen C (Al alloy thin film/glass substrate) obtained as described above were measured for reflectivity and average surface roughness Ra (arithmetic average surface roughness) Ra was measured by observing a measurement range of 2.5× 2.5 μm through an atomic force microscope (Nanoscopca of Digital Instrument Co., Ltd.). It was confirmed by the above analysis of composition that the Ag alloy thin film of the specimen A was an Ag-0.7% Nd-0.9% Cu alloy thin film and the Al alloy thin film of the specimen C was an Al-1.0% Ti alloy thin film.

The measurement results are shown in Table 1 together with the compositions and film forming conditions of these thin films. As understood from Table 1, reflectivity drops as average surface roughness Ra increases in the pure Ag thin film and the Ag alloy thin film (Ag-0.7% Nd-0.9% Cu alloy thin film). Particularly when the average surface roughness Ra becomes higher than 2.0 nm, reflectivity greatly drops and there is almost no significant difference in reflectivity between the Al alloy thin film and the Ag alloy thin film.

As the pressure of an Ar gas at the time of film formation rises, the average surface roughness Ra of the obtained pure Ag thin film and the average surface roughness Ra of the obtained Ag alloy thin film become higher. The average surface roughness Ra of the pure Ag thin film is increased by a heat treatment and becomes higher as the heat treatment temperature rises. The average surface roughness Ra of the Ag alloy thin film is lower than that of the pure Ag thin film and that of the Al alloy thin film.

Example 2 and Comparative Example 2

A pure Ag target having a diameter of 101.6 mm was used to form a 100 nm-thick pure Ag thin film on a glass substrate (Corning #1737, diameter: 50 mm, thickness: 0.5 mm) by DC magnetron sputtering so as to obtain a specimen D.

A 5 mm² metal chip (Nd or Y) was placed on a pure Ag target having a diameter of 101.6 mm and used as a target to form a 100 nm-thick Ag alloy thin film (Ag—Nd alloy thin film or Ag—Y alloy thin film) on the same glass substrate as above in the same manner as above so as to obtain a specimen E.

Further, a 5 mm² metal chip (Au, Cu, Pd or Pt) was placed on a pure Ag target having a diameter of 101.6 mm and used as a target to form a 100 nm-thick Ag alloy thin film (Ag—Au alloy thin film, Ag—Cu alloy thin film, Ag—Pd alloy thin film or Ag—Pt alloy thin film) on the same glass substrate as above in the same manner as above so as to obtain-a specimen F.

As for the forming conditions for all the above thin films, the substrate temperature was room temperature, the distance between target and substrate was 55 mm, the film forming power was 100 W, and the pressure of Ar gas was 2 mTorr.

To investigate the compositions of the above Ag alloy thin films, the same target as above was used to form an Ag alloy thin film on float glass in the same manner as above to analyze the compositions of the films by ICP.

The specimen D (pure Ag thin film/glass substrate), specimen E (Ag alloy thin film/glass substrate) and specimen F (Ag alloy thin film/glass substrate) obtained as described above were measured for reflectivity and average surface roughness Ra (arithmetic average surface roughness) by the same methods as in Example 1. The reflectivity was a value at a wavelength of 650 nm.

After the above specimen D, specimen E and specimen F were heated in the air at 250° C. for 1 hour, they were measured for reflectivity and average surface roughness Ra (arithmetic average surface roughness) by the same methods as in Example 1. It was confirmed by the above analysis of composition that the Ag alloy thin film of the specimen E (to be referred to as "rare earth-containing Ag alloy thin film" hereinafter) had composition shown in Table 2 (Ag—Nd alloy thin film or Ag—Y alloy thin film), and the Ag alloy thin film of the specimen F (to be referred to as "precious metal-containing Ag alloy thin film" hereinafter) had composition shown in Table 2 (Al—Au alloy thin film, Al—Cu alloy thin film, Al—Pd alloy thin film or Al—Pt alloy thin film).

The above measurement results are shown in Table 2 together with the compositions of the thin films. As understood from Table 2, the pure Ag thin film has a low average surface roughness Ra and a high reflectivity (initial reflectivity) after film formation and before the heat treatment but a high average surface roughness Ra and a low reflectivity after the heat treatment (250° C.×1 hour). That is, the average surface roughness Ra is significantly increased and the reflectivity is greatly reduced by the heat treatment with the result of low heat resistance.

The precious metal-containing Ag alloy thin film (Ag alloy thin film of the specimen F) has higher heat resistance than the pure Ag thin film. Although an increase in its average surface roughness Ra and a reduction in its reflectivity caused by the heat treatment are small, its average surface roughness Ra after the heat treatment (250° C.×1 hour) is higher than 2.0 nm and its reflectivity is low.

In contrast to this, the rare earth-containing Ag alloy thin film (Ag alloy thin film of the specimen E) has excellent heat resistance, and an increase in its average surface roughness Ra and a reduction in its reflectivity caused by the heat treatment (250° C.×1 hour) are small.

Out of these alloy thin films, the Ag—Nd alloy thin film which has an Nd content of 0.1% (Ag-0.1Nd alloy thin film) has an average surface roughness Ra before the heat treatment of 1.2 nm and a high initial reflectivity of 89.6% like the pure Ag thin film but its average surface roughness Ra after the heat treatment (250° C.×1 hour) is 2.0 nm which is slightly higher than that before the heat treatment and its reflectivity is 83.9% which is much higher than that of the pure Ag thin film.

An Ag alloy thin film having an Nd content of 0.3% (Ag-0.3Nd alloy thin film) has an average surface roughness Ra of 0.9 nm and a reflectivity of 86.2% after a heat treatment (250° C.×1 hour). A reduction in its reflectivity caused by the heat treatment is small. An increase in average surface roughness caused by the heat treatment (250° C.×1 hour) is not observed in an Ag alloy thin film having a higher Nd content, and a reduction in its reflectivity caused by the heat treatment becomes smaller as the content of Nd rises. When the content of Nd is 3.0% or more, a reduction in reflectivity caused by the heat treatment is not observed. The initial reflectivity lowers as the content of Nd rises, and an Ag alloy thin film having an Nd content of 4.0% has an initial reflectivity of 78.5%.

An Ag1.0Y alloy thin film has slightly lower or the same initial reflectivity as the Ag-1.0Nd alloy thin film. Its reflectivity after a heat treatment (250° C.×1 hour) is slightly lower than that of the Ag-0.1Nd alloy thin film and a reduction in its reflectivity caused by the heat treatment is slightly larger than that of the Ag-0.1Nd alloy thin film.

Example 3

An Ag-0.7% Nd target (cast material) having a diameter of 101.6 mm was used to form a 100 nm-thick Ag alloy thin film (Ag—Nd alloy thin film) on a glass substrate (Corning #1737, diameter: 50 mm, thickness: 0.5 mm) by DC magnetron sputtering so as to obtain a specimen G.

A 5 mm² metal chip (Cu, Au, Pd or Pt) was placed on an Ag-0.7% Nd target material (cast material) having a diameter of 101.6 mm and used as a target to form a 100 nm-thick Ag alloy thin film (Ag—Nd—Cu alloy thin film, Ag—Nd—Au alloy thin film, Ag—Nd—Pd alloy thin film or Ag—Nd—Pt alloy thin film) on the same glass substrate as above in the same manner as above so as to obtain a specimen H.

As for the forming conditions for all the above specimens, the substrate temperature was room temperature, the distance between target and substrate was 55 mm, the film forming power was 100 W, and the pressure of Ar gas was 2 mTorr.

To investigate the compositions of the above Ag alloy thin films, the same target as above was used to form an Ag alloy thin film on float glass in the same manner as above to analyze the composition of the film by ICP.

The specimen G (Ag alloy thin film/glass substrate) and the specimen H (Ag alloy thin film/glass substrate) obtained as described above were measured for reflectivity and average surface roughness Ra (arithmetic average surface roughness) by the same methods as in Example 1.

After the specimen G and the specimen H were heated in the air at 250° C. for 1 hour, they were measured for reflectivity and average surface roughness Ra (arithmetic average surface roughness) by the same methods as in Example 1. It was confirmed by the above analysis of composition that the Ag alloy thin film of the specimen G (to be referred to as "Ag—Nd alloy thin film" hereinafter) had composition shown in Table 3 and the Ag alloy thin film of the specimen H (to be referred to as "Ag—Nd-precious metal alloy thin film" hereinafter) had composition shown in Table 3 (Ag—Nd—Cu alloy thin film, Ag—Nd—Au alloy thin film, Ag—Nd—Pd alloy thin film or Ag—Nd—Pt alloy thin film).

Further, a salt water immersion test (NaCl concentration: 0.05 mol/l, immersion time: 15 minutes) was made on the above specimen G and specimen H (right after film formation, that is, before the above heat treatment) to observe the color change and peeling of each of the specimens with the eye. When peeling and the color change of the entire surface were observed with the eye, the specimen was evaluated as x (not satisfactory), when 20 or more white points as long as 1 mm or more were observed on the substrate, the specimen was evaluated as Δ, when 5 to 20 white points were observed, it was evaluated as ○ (satisfactory), and when no point was observed, it was evaluated as ◎ (excellent).

The results of the above measurement and test are shown in Table 3 together with the compositions of the thin films. As understood from Table 3, the Ag alloy thin film of the specimen G (Ag-0.7Nd alloy thin film) had low salt water resistance as it was evaluated as x in the salt water immersion test. In contrast to this, the salt water resistance of the Ag alloy thin film (Ag—Nd-precious metal alloy thin film) of the specimen H was evaluated as Δ, ○ (satisfactory) or ◎ (excellent) except the Ag-0.7Nd-0.3Cu alloy thin film. That is, the salt water resistance is improved by adding Cu, Au, Pd or Pt to Ag—Nd and as the content of the element increases, the salt water resistance becomes higher. Meanwhile, as the content of the element increases, the initial reflectivity tends to drop.

Example 4 and Comparative Example 3

An Ag-0.7% Nd target (cast material) having a diameter of 101.6 mm was used to form an Ag alloy thin film (Ag—Nd alloy thin film) on a glass substrate (Corning #1737, diameter: 50 mm, thickness: 0.5 mm) by DC magnetron sputtering so as to obtain a specimen I. The thickness of the film was changed.

An Ag-1.0% Au target, Ag-1.0% Cu target and Ag-1.0% Pd target (cast materials) having a diameter of 101.6 mm were used to form Ag alloy thin films (Ag—Au alloy thin film, Ag—Cu alloy thin film, Ag-Pd alloy thin film) on a glass substrate (Corning #1737, diameter: 50 mm, thickness: 0.5 mm) by DC magnetron sputtering so as to obtain specimens J, respectively. The thickness of each film was changed.

As for the forming conditions for all the above specimens, the substrate temperature was room temperature, the distance between target and substrate was 55 mm, the film forming power was 100 W, and the pressure of Ar gas was 2 mTorr. The thickness of the Ag alloy thin film was changed by controlling the film forming time.

The specimens I (Ag alloy thin film/glass substrate) and specimens J (Ag alloy thin film/glass substrate) obtained as described above were measured for reflectivity and average surface roughness Ra (arithmetic average surface roughness) by the same methods as in Example 1.

The results of the measurements are shown in Table 4 together with the compositions and thicknesses of the thin films As understood from Table 4, as the thickness of the film increases, the average surface roughness becomes higher and the reflectivity becomes lower. When the thickness of the film is smaller than 50 nm, the reflectivity greatly lowers apparently as light passes through the film.

Example 5 and Comparative Example 4

An Ag-0.7% Nd target (cast material) having a diameter of 101.6 mm was used to form a 100 nm-thick Ag alloy thin film (Ag—Nd alloy thin film) on a glass substrate (Corning #1737, diameter: 50 mm, thickness: 0.5 mm) by DC magnetron sputtering so as to form a specimen K.

An Ag-1.0% Au target, Ag-1.0% Cu target and Ag-1.0% Pd target (cast materials) having a diameter of 101.6 mm were used to form 100 nm-thick Ag alloy thin films (Ag—Au alloy thin film, Ag—Cu alloy thin film and Ag—Pd alloy thin film) on a glass substrate (Corning #1737, diameter: 50 mm, thickness: 0.5 mm) by DC magnetron sputtering so as to obtain specimens L, respectively.

As for the forming conditions for all the above specimens, the distance between target and substrate was 55 mm, the film forming power was 100 W, and the pressure of Ar gas was 2 mTorr. The substrate temperature was changed as a parameter. That is, the substrate temperature was changed to room temperature (23° C.), 50° C., 100° C., 150° C., 200° C. and 250° C.

The specimen K (Ag alloy thin film/glass substrate) and specimens L (Ag alloy thin film/glass substrate) obtained as described above were measured for reflectivity and average surface roughness Ra (arithmetic average surface roughness) by the same methods as in Example 1.

The results of the measurements are shown in Table 5 together with the compositions and film forming temperatures (substrate temperatures) of the thin films. As understood from Table 5, the substrate temperature for forming a film was 100° C. and the average surface roughness Ra was as high as more than 2.0 nm in the case of the Ag—Au alloy thin film, Ag—Cu alloy thin film and Ag-Pd alloy thin film. That is, when a film was formed at a substrate temperature of 100° C., the average surface roughness of the obtained thin film increased. In contrast to this, the average surface roughness Ra of the Ag—Nd alloy thin film was low at 2.0 nm or less even when the substrate temperature for forming a film was 100° C. or 150 to 250° C. Thus, the Ag—Nd alloy thin film is little influenced by the substrate temperature for forming a film. When the substrate temperature is 200° C. or lower, it rarely increases the average surface roughness of a thin film.

TABLE 1

| specimen | composition of thin film (at %) | pressure of Ar gas for film formation (mTorr) | vacuum heat treatment temperature (°C.) | average surface roughness Ra (nm) | Reflectivity (%) wavelength of 400 nm | Reflectivity (%) wavelength of 600 nm |
|---|---|---|---|---|---|---|
| A | Ag—0.7Nd—0.9Cu | 2 | — | 0.6 | 87.5 | 90.2 |
|   | Ag—0.7Nd—0.9Cu | 5 | — | 0.8 | 87.6 | 90.3 |
|   | Ag—0.7Nd—0.9Cu | 10 | — | 2.1 | 80.2 | 89.2 |
| B | pure Ag | 1 | — | 1.64 | 89.3 | 92.2 |
|   | pure Ag | 5 | — | 1.89 | 88.7 | 91.8 |
|   | pure Ag | 2 | 150 | 2.4 | 81.5 | 90.2 |
|   | pure Ag | 2 | 200 | 6.7 | 73.2 | 89.5 |
| C | Al—1.0Ti | 2 | — | 1.6 | 80.2 | 80.3 |

TABLE 2

| specimen | composition of thin film (at %) | before heat treatment Ra (nm) | before heat treatment reflectivity (%) | after heat treatment (250° C. × 1 hr. Air) Ra (nm) | after heat treatment (250° C. × 1 hr. Air) reflectivity (%) |
|---|---|---|---|---|---|
| D | pure Ag | 1.7 | 89.5 | 6.2 | 74.2 |
| E | Ag—0.1Nd | 1.2 | 89.6 | 2.0 | 83.9 |
|   | Ag—0.3Nd | 0.8 | 88.4 | 0.9 | 86.2 |
|   | Ag—0.5Nd | 0.6 | 88.2 | 0.7 | 86.3 |
|   | Ag—0.7Nd | 0.6 | 87.6 | 0.6 | 86.4 |
|   | Ag—1.0Nd | 0.7 | 85.3 | 0.6 | 85.2 |
|   | Ag—2.0Nd | 0.6 | 82.4 | 0.5 | 81.8 |
|   | Ag—3.0Nd | 0.5 | 80.1 | 0.6 | 80.2 |
|   | Ag—4.0Nd | 0.5 | 78.5 | 0.6 | 77.9 |
|   | Ag—1.0Y | 0.6 | 84.6 | 0.6 | 83.4 |
| F | Ag—1.0Au | 1.3 | 89.5 | 2.5 | 80.6 |
|   | Ag—1.0Cu | 1.2 | 89.2 | 3.2 | 79.2 |
|   | Ag—1.0Pd | 1.4 | 86.4 | 2.1 | 79.5 |
|   | Ag—1.0Pt | 1.6 | 86.3 | 2.3 | 78.6 |

TABLE 4

| specimen | composition of thin film (at %) | film thickness (nm) | as-formed Ra (nm) | as-formed reflectivity (%) |
|---|---|---|---|---|
| I | Ag—0.7Nd | 25 | 0.4 | 60.4 |
|   |   | 50 | 0.5 | 85.8 |
|   |   | 75 | 0.7 | 882 |
|   |   | 100 | 0.7 | 88.6 |
|   |   | 300 | 1.0 | 88.9 |
|   |   | 500 | 1.8 | 83.1 |
| J | Ag—1.0Au | 100 | 1.5 | 84.2 |
|   | Ag—1.0Cu | 100 | 1.6 | 85.2 |
|   | Ag—1.0Pd | 100 | 1.4 | 86.4 |

TABLE 3

| specimen | composition of thin film (at %) | before heat treatment Ra (nm) | before heat treatment initial reflectivity | after heat treatment Ra (nm) | after heat treatment reflectivity (%) | result of salt water immersion test |
|---|---|---|---|---|---|---|
| G | Ag—0.7Nd | 0.6 | 87.5 | 0.6 | 86.4 | X |
| H | Ag—0.7Nd—0.3Cu | 0.5 | 87.5 | 0.6 | 87.2 | X |
|   | Ag—0.7Nd—0.5Cu | 0.5 | 87.7 | 0.7 | 87.3 | Δ |
|   | Ag—0.7Nd—1.0Cu | 0.6 | 87.6 | 0.7 | 86.9 | ○ |
|   | Ag—0.7Nd—3.0Cu | 0.6 | 86.4 | 0.5 | 85.6 | ○ |
|   | Ag—0.7Nd—5.0Cu | 0.4 | 84.3 | 0.5 | 83.1 | ○ |
|   | Ag—0.7Nd—7.0Cu | 0.4 | 81.1 | 0.4 | 80.1 | ○ |
|   | Ag—0.7Nd—0.3Au | 0.8 | 87.6 | 0.9 | 87.5 | Δ |
|   | Ag—0.7Nd—0.5Au | 0.7 | 87.8 | 0.8 | 87.6 | ○ |
|   | Ag—0.7Nd—1.0Au | 0.6 | 87.7 | 0.7 | 87.9 | ◎ |
|   | Ag—0.7Nd—3.0Au | 0.7 | 87.2 | 0.6 | 86.9 | ◎ |
|   | Ag—0.7Nd—5.0Au | 0.8 | 85.3 | 0.9 | 86.3 | ◎ |
|   | Ag—0.7Nd—7.0Au | 0.5 | 83.6 | 0.6 | 82.5 | ◎ |
|   | Ag—0.7Nd—0.3Pd | 0.9 | 86.5 | 1.0 | 86.4 | Δ |
|   | Ag—0.7Nd—0.5Pd | 0.6 | 85.2 | 0.8 | 86.3 | ◎ |
|   | Ag—0.7Nd—1.0Pd | 0.8 | 85.3 | 0.9 | 84.2 | ◎ |
|   | Ag—0.7Nd—3.0Pd | 0.7 | 82.1 | 0.6 | 81.6 | ◎ |
|   | Ag—0.7Nd—5.0Pd | 0.7 | 80.9 | 0.8 | 80.2 | ◎ |
|   | Ag—0.7Nd—7.0Pd | 0.7 | 78.1 | 0.9 | 78.6 | ◎ |
|   | Ag—0.7Nd—1.0Pt | 0.6 | 84.3 | 0.8 | 83.8 | ○ |

TABLE 5

| specimen | composition of thin film (at %) | Substrate temperature (° C.) | as-formed Ra (nm) | reflectivity (%) |
|---|---|---|---|---|
| K | Ag—0.7Nd | 23 | 0.7 | 87.5 |
|   |   | 50 | 0.6 | 87.4 |
|   |   | 100 | 0.7 | 88.4 |
|   |   | 150 | 0.6 | 88.6 |
|   |   | 200 | 0.8 | 86.8 |
|   |   | 250 | 0.9 | 85.2 |
| L | Ag—1.0Au | 100 | 2.4 | 84.2 |
|   | Ag—1.0Cu | 100 | 2.9 | 86.5 |
|   | Ag—1.0Pd | 100 | 2.2 | 80.1 |

INDUSTRIAL FEASIBILITY

Since the reflective Ag alloy thin film for reflectors of the present invention has excellent surface flatness and shows high reflectivity even under a heating environment, it can be advantageously used as a reflective Ag alloy thin film for reflectors and its function can be improved.

As the reflector of the present invention has the reflective Ag alloy thin film for reflectors having the above excellent characteristic properties formed on a substrate, it can be advantageously used under a heating environment.

What is claimed is:

1. An automotive lamp comprising a reflective film, the reflective film comprising:
    an Ag-based alloy; and
    a substrate;
    wherein:
    the alloy comprises Pd, Pt or both Pd and Pt in a range of from 0.5 to 5.0 at %, and a rare earth element in a range of from 0.1 to 3.1 at %;
    a film comprising one or more nitrides selected from the group consisting of silicon nitride, aluminum nitride, and boron nitride is formed on the substrate as a primer layer; and
    the reflective film has an average surface roughness Ra of 2.0 nm or less.

2. The automotive lamp according to claim 1, wherein the substrate comprises a resin, glass, or metal.

3. The automotive lamp according to 1, wherein the film comprises one or more oxides selected from the group consisting of zinc oxide, tin oxide, titanium oxide, indium oxide, indium tin oxide, yttrium oxide, zirconium oxide, zirconium oxide, and aluminum oxide.

4. The automotive lamp according to claim 1, wherein the rare earth element comprises Nd.

5. The automotive lamp according to claim 1, wherein the alloy further comprises at least one element selected from the group consisting of Au and Cu in a range of from 0.5 to 5.0 at %.

6. The automotive lamp according to claim 1, wherein the reflective film has a thickness of from 50 to 300 nm.

7. The automotive lamp according to claim l, wherein the reflective film is obtained by heating the substrate at a temperature of from 50 to 200° C. at the time of film formation.

8. An automotive lamp comprising a reflective film, the reflective film comprising:
    an Ag-based alloy; and
    a substrate;
    wherein:
    the alloy comprises Pd, Pt or both Pd and Pt in a range of from 0.5 to 5.0 at %, and a rare earth element in a range of from 0.1 to 3.1 at %;
    a film comprising one or more oxynitrides is formed on the substrate as a primer layer; and
    the reflective film has an average surface roughness Ra of 2.0 nm or less.

9. The automotive lamp according to claim 8, wherein the substrate comprises a resin, glass, or metal.

10. The automotive lamp according to claim 8, wherein the film comprises one or more oxides selected from the group consisting of zinc oxide, tin oxide, titanium oxide, indium oxide, indium tin oxide, yttrium oxide, zirconium oxide, zirconium oxide, and aluminum oxide.

11. The automotive lamp according to claim 8, wherein the rare earth element comprises Nd.

12. The automotive lamp according to claim 8, wherein the alloy further comprises at least one element selected from the group consisting of Au and Cu in a range of from 0.5 to 5.0 at %.

13. The automotive lamp according to claim 8, wherein the reflective film has a thickness of from 50 to 300 nm.

14. The automotive lamp according to claim 8, wherein the reflective film is obtained by heating the substrate at a temperature of from 50 to 200° C. at the time of film formation.

15. An automotive lamp comprising a reflective film, the reflective film comprising:
    an Ag-based alloy; and
    a substrate;
    wherein:
    the alloy comprises Pd, Pt or both Pd and Pt in a range of from 0.5 to 5.0 at %, and a rare earth element in a range of from 0.1 to 3.1 at %;
    a film comprising silicon aluminum oxynitride is formed on the substrate as a primer layer; and
    the reflective film has an average surface roughness Ra of 2.0 nm or less.

16. The automotive lamp according to claim 15, wherein the substrate comprises a resin, glass, or metal.

17. The automotive lamp according to claim 15, wherein the film comprises one or more oxides selected from the group consisting of zinc oxide, tin oxide, titanium oxide, indium oxide, indium tin oxide, yttrium oxide, zirconium oxide, zirconium oxide, and aluminum oxide.

18. The automotive lamp according to claim 15, wherein the rare earth element comprises Nd.

19. The automotive lamp according to claim 15, wherein the alloy further comprises at least one element selected from the group consisting of Au and Cu in a range of from 0.5 to 5.0 at %.

20. The automotive lamp according to claim 15, wherein the reflective film has a thickness of from 50 to 300 nm.

21. The automotive lamp according to claim 15, wherein the reflective film is obtained by heating the substrate at a temperature of from 50 to 200° C. at the time of film formation.

* * * * *